United States Patent
Ho et al.

(10) Patent No.: US 7,342,317 B2
(45) Date of Patent: Mar. 11, 2008

(54) LOW COEFFICIENT OF THERMAL EXPANSION BUILD-UP LAYER PACKAGING AND METHOD THEREOF

(75) Inventors: Kwun-Yao Ho, Hsin Tien (TW); Moriss Kung, Hsin Tien (TW)

(73) Assignee: Via Technologies, Inc., Hsien Tien, Taipei Hsien (TW)

( * ) Notice: Subject to any disclaimer, the term of this patent is extended or adjusted under 35 U.S.C. 154(b) by 287 days.

(21) Appl. No.: 10/980,168

(22) Filed: Nov. 4, 2004

(65) Prior Publication Data

US 2005/0189644 A1 Sep. 1, 2005

(30) Foreign Application Priority Data

Feb. 27, 2004 (TW) ............... 93105187 A

(51) Int. Cl.
| | |
|---|---|
| H01L 23/52 | (2006.01) |
| H01L 23/48 | (2006.01) |
| H01L 29/40 | (2006.01) |
| H01L 23/538 | (2006.01) |
| H01L 21/44 | (2006.01) |
| H01L 21/4763 | (2006.01) |

(52) U.S. Cl. ............... 257/774; 257/E23.174; 438/637; 438/667; 438/672; 438/675

(58) Field of Classification Search ......... 257/698, 257/700, 737, 774, E23.174; 438/667, 668, 438/672, 675, 637
See application file for complete search history.

(56) References Cited

U.S. PATENT DOCUMENTS

| | | | | |
|---|---|---|---|---|
| 4,994,902 | A * | 2/1991 | Okahashi et al. | 257/665 |
| 6,111,313 | A * | 8/2000 | Kutlu | 257/697 |
| 6,351,031 | B1 * | 2/2002 | Iijima et al. | 257/698 |
| 6,506,633 | B1 * | 1/2003 | Cheng et al. | 438/126 |
| 6,992,379 | B2 * | 1/2006 | Alcoe et al. | 257/700 |
| 2003/0034566 | A1 * | 2/2003 | Jimarez et al. | 257/778 |
| 2005/0056942 | A1 * | 3/2005 | Pogge et al. | 257/778 |

* cited by examiner

*Primary Examiner*—Luan Thai
(74) *Attorney, Agent, or Firm*—Birch, Stewart, Kolasch & Birch, LLP

(57) ABSTRACT

A build-up layer packaging comprising a first ceramic substrate, a second ceramic substrate, and a circuit layer is provided. The first ceramic substrate has a through hole to dispose a die therein. The second ceramic substrate, attached to a common lower surface of the ceramic substrate and the die, further has a plurality of openings to expose the pads of the die. The openings are filled with plugs electrically connecting to the pads. The circuit layer is formed under the second ceramic substrate to transmit signals generated by the die outward.

24 Claims, 4 Drawing Sheets

LOW COEFFICIENT OF THERMAL EXPANSION BUILD-UP LAYER PACKAGING AND METHOD THEREOF

BACKGROUND OF THE INVENTION (1) Field of the Invention

This invention relates to a build-up layer packaging and a method thereof, and more particularly to a low coefficient of thermal expansion (CTE) build-up layer packaging formed by using co-fired ceramic technology.

(2) Description of Related Art

As the prosperity of the semiconductor fabrication technology, a central processing unit (CPU) characterized with small-size, multi-function, and high-speed becomes popular. Such CPU needs an increased number of input/output (I/O) contacts to transmit data for various functions, and is usually formed with arrayed I/O pads to increase I/O density (pitch≦200 μm). To deal with the arrayed I/O pads, a flip-chip packaging method, in which a die is connected to a packaging substrate by using bumps, is usually used.

FIG. 1 is a schematic view of a traditional flip-chip packaging. A core substrate 10 is provided as a main body to have an upper circuit layer 12 and a lower circuit layer 14 on opposing sides (upper side and lower side, respectively) by using a traditional build-up layer technology. A plurality of pins 16 is connected to the lower circuit layer 14 for plugging into the respective slots on a main board (not shown). A die 20 is flipped and placed on the upper circuit layer 12, and connects to the upper circuit layer 12 through a plurality of arrayed metal bumps 22 formed on a lower surface of the die 20. Therefore, a signal generated from the die 20 must pass through the bump 22, the upper circuit layer 12, a plated through hole (PTH) (not shown) in the core substrate 10, the lower circuit layer 14, and the pin 16 before reaching the main board.

It is noted that the core substrate 10 must have enough thickness to prevent circuit breakage in the upper circuit layer 12 and the lower circuit layer 14 mainly due to unexpected core substrate's torsion. Whereas the thickness of the core substrate 10 is increased to avoid possible breakage in the core substrate 10, some unwanted results such as thicker packaging, longer signal transmission distance from the die to the pin and so on can be raised. Moreover, as the thickness of the core substrate 10 is increased, the process of drilling PTH in the core substrate 10 becomes more difficult and thus limits the density of PTH. Therefore, the traditional flip-chip packaging of FIG. 1 now hits a bottleneck while the contemporary technology meets an increasing need in extending the I/O number and the density. To overcome the aforesaid bottleneck, a bumpless build-up layer packaging (BBUL) technology is introduced in time.

FIGS. 2A through 2F are schematic views of the BBUL packaging method. Firstly, as shown in FIG. 2A, a packaging substrate 100 is provided with a through hole 102. A temporal substrate 110 is formed under a bottom surface of the packaging substrate 100 so as to block a bottom end of the through hole 102a and thus to form a space with an upward opening for placing a die 200 therein. Referring to FIG. 2B, after the die 200 is placed into the through hole 102, the temporal substrate 110 is removed to expose the pads 202 on a lower surface of the die 200.

Thereafter, as shown in FIG. 2C, a dielectric layer 122 is formed on a common lower surface of the packaging substrate 100 and the die 200, and the pads 202 of the die 200 are also covered as shown. The dielectric layer 122 is then drilled by using a laser to form a plurality of openings 124 for exposing the pads 202. Afterward, as shown in FIG. 2D, a metal pattern 126 is formed on a lower surface of the dielectric layer 122 and fills the opening 124 (see FIG. 2C) to connect the pads 202. By repeating the steps of FIGS. 2C and 2D, the dielectric layers and the metal patterns are form alternatively to conclude a circuit layer 120 of FIG. 2E. Afterward, as shown in FIG. 2F, a solder mask (SM) 130 with a plurality of openings is formed on a lower surface of the circuit layer 120. Finally, the openings are then printed with solder 140 for further connecting a plurality of pins 150.

As mentioned, in the BBUL packaging method, the die 200 is placed and fixed in the packaging substrate 100, the lower surface of the die 200 and the packaging substrate 100 are applied with build-up layer technology to form the circuit layer 120, and then the pins 150 follows. Therefore, the signal generated in the die 200 only has to pass through the circuit layer 120 and the pin 150 before reaching the main board, and the thickness of the packaging and the energy dissipation during signal transmission are also reduced. It is calculated that, by compared to the traditional flip-chip packaging, the BBUL packaging reduces at least 30% of parasitic inductance, and saves at least 25% of power consumption during signal transmission in the packaging.

In addition, with a decrease of processor size and an increase of element density, an RC time delay effect resulted by the circuit inside the packaging becomes a main cause that affects the calculation speed of the processor. It is noted that the RC time delay of the packaging is a product of the resistance (R) of the metal patterns and the capacitance (C) of the dielectric layer between the metal patterns. Thus, there are two methods to minimize the RC time delay effect; in which one is to use low resistance metal materials, for example copper, to compose the metal pattern, and another is to use low dielectric parameter (K) materials to compose the dielectric layer.

It is well known in the art that an advanced low K material is more brittle than other traditional dielectric materials. In a traditional flip-chip packaging, which uses bumps as electric connections between a die and a packaging substrate, the dielectric layer covering the die suffers a pressure from the bump. If a brittle low K material is used to form the dielectric layer, the surface layers of the die will be vulnerable to break the circuit therein and thus decrease the yield. In the BBUL packaging of FIG. 2F, the die 200 is placed and fixed inside the packaging substrate 100, and the circuit layer 120 is directly formed on the lower surface of the die 200 and, therefore, no bumps are needed in such a structure. So, upon such an arrangement of the bumpless packaging, damage causes by using low K material bumps can be prevented.

However, in the traditional BBUL packaging, the die and the packaging substrate are composed of materials with a significant difference in coefficient of thermal expansion (CTE). For example, a typical packaging substrate is usually formed by an organic material having a CTE around 20 ppm/° C., while a typical silicon die has a CTE of 4.5 ppm/° C. The difference of CTEs between the packaging substrate and the die is estimated up to 15.5 ppm/° C. Therefore, upon a thermal stress in any thermal cycle in the packaging process or upon a residue stress existing between the die and the packaging substrate by a dimensional mismatch during manufacturing, the connection between the die and the packaging substrate may be accidentally broken and fail the packaging.

Moreover, as shown in FIGS. 2C through 2E, in the BBUL packaging process, a laser drilling step and a build-up layer step are carried out after the die is placed and fixed inside the substrate. Therefore, any defect in such laser drilling and build-up layer steps may eventually fail the packaging and thus reduce the yield. Definitely, the die inside the substrate in a failed packaging is impossible to be used again.

SUMMARY OF THE INVENTION

Accordingly, the present invention reduces the thickness of the packaging, and saves the energy dissipation in the packaging during signal transmission.

The present invention prevents the formation of stress in the package due to a difference in coefficient of thermal expansion (CTE) between the die and the packaging substrate.

The present invention also solves the problem of the BBUL packaging that the die placed and fixed inside the substrate is hard to be removed for re-usage.

This present invention introduces a build-up layer packaging, which comprises a first ceramic substrate, a second ceramic substrate, and a circuit layer. The first ceramic substrate has a through hole and a die placed in the through hole further having a plurality of pads on a lower surface thereof. The second ceramic substrate placed on a common lower surface of the first ceramic substrate and the die further has a plurality of openings to expose the pads on the die. A plurality of conductive plugs are filled inside the openings and thus electrically connected to the pads. A conductive pattern is formed on a lower surface of the second ceramic substrate to connect to the plugs. The circuit layer is formed on a common lower surface of the conductive pattern and the second ceramic substrate to deliver outward the signal generated from the die.

This present invention also introduces a packaging method. In the beginning, a first green tape substrate with a through hole having a size respect to the die is formed by a ceramic material. Then, a second green tape substrate having a plurality of openings respective to the pads on the die is formed by a ceramic material. Afterward, the openings on the second green tape substrate are filled with conductive plugs, and further a conductive pattern is formed on a lower surface of the second green tape substrate. Then, the first green tape substrate and the second green tape substrate are held together and a sintering process is carried out to result in a first ceramic substrate with a second ceramic substrate attached therebelow, wherein the first ceramic substrate is resulted from the first green tape substrate and the second ceramic substrate is resulted from the second green tape substrate. Subsequently, a circuit layer is formed on a lower surface of the second ceramic substrate. Finally, the die is flipped and located into the through hole of the first ceramic substrate and thus electrically connects to the plugs.

Reference will now be made in detail to the preferred embodiments of the present invention, examples of which are illustrated in the accompanying drawings. Wherever possible, the same reference numbers will be used throughout the drawings to refer to the same or like parts.

BRIEF DESCRIPTION OF THE DRAWINGS

The present invention will now be specified with reference to its preferred embodiment illustrated in the drawings, in which.

DETAIL DESCRIPTION OF THE PREFERRED EMBODIMENTS

Figure 3A:
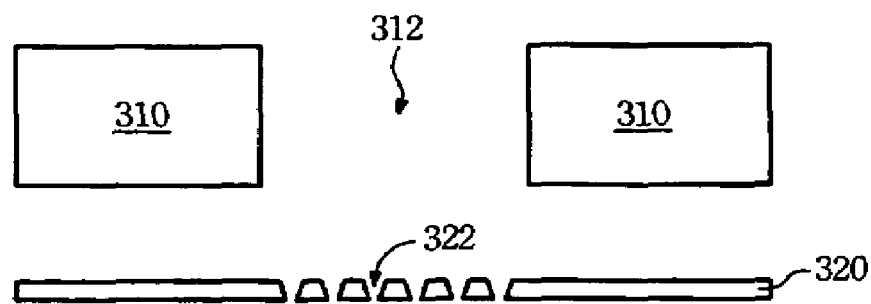
FIGS. 3A through 3E depict schematic cross-section views of a preferred embodiment of a packaging process by using a low CTE build-up layer packaging in accordance with the present invention.

FIGS. 3A through 3E depict schematic cross-section views of a preferred embodiment to package a die into a build-up layer packaging in accordance with the present invention. Firstly, as shown in FIG. 3A, a first green tape substrate 310 is cut from a green ceramic tape (not shown), and then a through hole 312 for locating a die is shaped by penetrating the first green tape substrate 310 by a puncher or a laser. A second green tape substrate 320 is cut from another green ceramic tape with a smaller thickness with respect to the first green tape substrate 310, and a plurality of openings 322 with respect to pads on the die is formed in the second green tape substrate 320 by using a laser. In addition, the first green tape substrate 310 and the second green tape substrate 320 have approximately the same surface area.

Figure 3B:
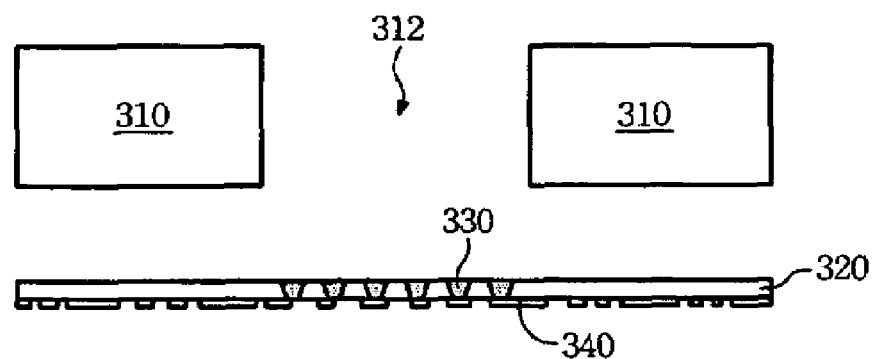
Figure 3C:
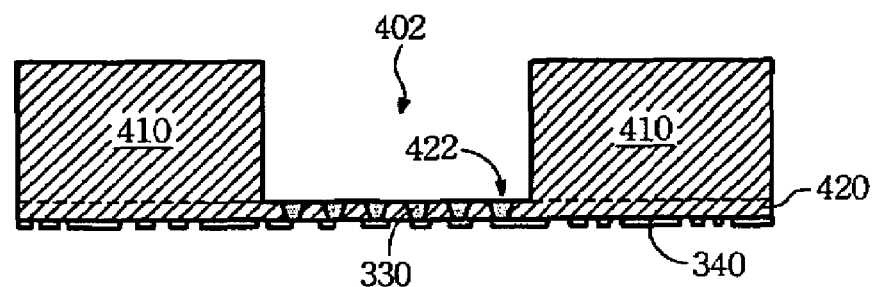

Afterward, as shown in FIG. 3B, a plurality of conductive plugs 330 are filled into the openings 322 of the second green tape substrate 320, and a conductive pattern 340, which may be formed of a metallic material, is formed on a lower surface of the second green tape substrate 320. Thereafter, as shown in FIG. 3C, after the first green tape substrate 310 and the second green tape substrate 320 are aligned and held together, a sintering step is carried out. It should be noted that there is a high percentage of binder mixed in the first green tape substrate 310 and the second green tape substrate 320 for binding the ceramic powder. During the sintering step, the ceramic material is exchanged at the interface between the first green tape substrate 310 and the second green tape substrate 320 so as to have the first green tape substrate 310 and the second green tape substrate 320 attaching to each other.

Because the binder in the first green tape substrate 310 and the second green tape substrate 320 are burned and removed in the sintering step, the resulted first ceramic substrate 410 and the second ceramic substrate 420 experience a shrinkage with respect to the original first green tape substrate 310 and the second green tape substrate 320. The size shrinkage in the sintering step should be carefully calculated and compensated in the previous shaping steps of FIGS. 3A and 3B to make sure that the size of the through hold 402 in the first ceramic substrate 410 can fit the die and the openings 422 in the second ceramic substrate 420 can align with the pads on the die.

An alternative substrate arrangement can be implemented. For example, there can be a green tape ceramic substrate (not shown) disposed between the first ceramic substrate 410 and the second ceramic substrate 420. The three substrates are aligned and held together so as to have the three substrates attaching with each other after a sintering process is carried out.

Figure 3D:
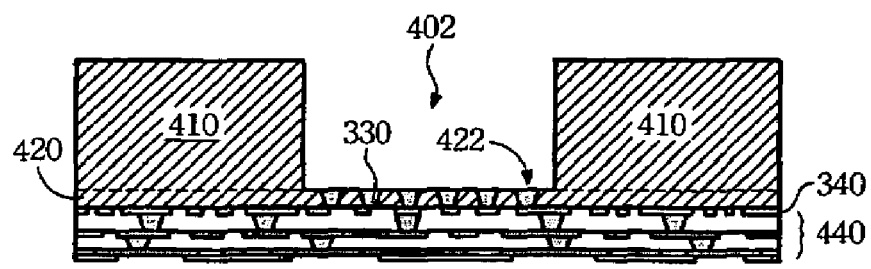

Afterward, as shown in FIG. 3D, a circuit layer 440 with an organic dielectric material inside is formed on a common lower surface of the second ceramic substrate 420 and the conductive pattern 340 by using build-up layer technology. It is noted that the combination of the conductive pattern 340 and the circuit layer 440 includes at least a layout circuit layer, a grounded layer, and a power supply layer. A power supply circuit is to provide a driving voltage for driving the signals into the circuit layer 440 and further to leave the packaging. If the conductive pattern 340 forms a layout circuit layer, the circuit layer 440 should have a grounded layer 442 and a power supply layer 444 formed therein with respect to the layout circuit layer. If the conductive pattern 340 only plays a role of data transmission, the circuit layer 440 must have at least a layout circuit layer, a grounded layer, and a power supply layer formed therein. It is also noted that, by having the circuit layer 440 supported by the first ceramic substrate 410 and the second ceramic substrate 420, the circuit layer 440 may be formed with a smaller line width and a higher circuit density by using the build-up layer technology.

Figure 3E:
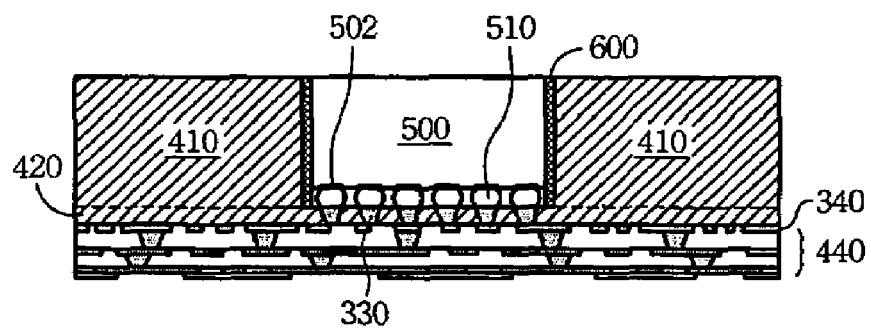

Finally, referring to FIG. 3E, as the die 500 is flipped and put into the through hole 402 of the first ceramic substrate 410, the pads 502 on a lower surface of the die 500 should be aligned with the openings 422 of the second ceramic substrate 420. A glue material 600 is filled between the ceramic composed die 500 and the ceramic composed first ceramic substrate 410 so as to have the die 500 fixed in the through hole 402. A plurality of bumps 510 is formed on the pads 502 to connect the plugs 330 and to create an acceptable electric connection between the pads 502 and the plugs 330.

In order to have the signal in the packaging transmitted to a circuit board, a solder mask (not shown) with a plurality of openings is usually formed on a lower surface of the circuit layer 440 so as to allow a plurality of bumps or pins (not shown) to form in the openings. Therefore, the signal generated in the die 500 in accordance with the present invention can pass through the pad 502, the bump 510, the plug 330, the conductive pattern 340, the circuit layer 440, and finally the bumps or pins to leave the packaging.

The table below represents the coefficient of thermal expansion (CTE) of typical packaging materials. It is noted that a main portion of the packaging in accordance with the present invention, the first ceramic substrate 410 and the second ceramic substrate 420, is composed of ceramic materials (including a glass-ceramic material). Under such a composition, AlN or SiC may be a better choice of the packaging. For example, if the second ceramic substrate 420 is formed of AlN, which has a CTE of 4.5 ppm/° C., and the die 500 is formed of Si, which has a CTE of 3 ppm/° C., the CTEs of the two materials are so close that can minimize the dimensional mismatch problem and prevent the connection between the pads 502 and the plugs 330 from broken.

|  | Material | CTE (ppm/° C.) |
|---|---|---|
| Organic substrate | Bismaleimide-Triazine (BT) | 18 |
| Organic substrate | Polyimide (PI) | 21 |
| Ceramic substrate | AlN | 4.5 |
| Ceramic substrate | SiC | 4.6 |
| Die | Si | 3 |

Figure 4:
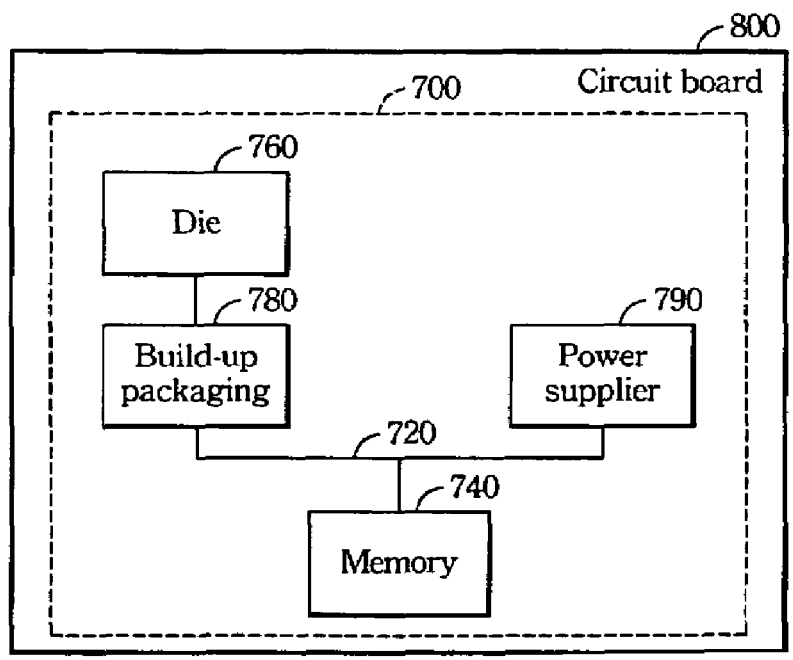
FIG. 4 depicts a schematic view of a preferred embodiment of a computer system in accordance with the present invention.

FIG. 4 shows a preferred embodiment of a computer system 700 in accordance with the present invention. The computer system 700, which is set on a circuit board 800, has a bus 720, a memory 740, a die 760, a build-up layer packaging 780, and a power supplier 790. The bus 720 is formed on the circuit board 800 and connects to the memory 740, the build-up layer packaging 780, and the power supplier 790. The die 760 is assembled in the build-up layer packaging 780, and the signals generated in the die 760 are transmitted through the build-up layer packaging 780 to the bus 720. In order to have the die 760 fixed, the build-up layer package 780 has a first ceramic substrate, a second ceramic substrate, and a circuit layer as described above. The first ceramic substrate has a through hole for locating the die 760, and the second ceramic substrate is attached to a lower surface of the first ceramic substrate and covers a lower surface of the die 760. The die 760 is flipped and fixed in the through hole and the signal generated by the die 760 is delivered to the bus 720 through the circuit layer.

The die 760 may be a microprocessor to control the basic operation of the computer system, or a chipset to control signal communication on the circuit board. Also, the die 760 may be a communication chip of a communication system to execute wire or wireless communication.

By contrast with the traditional flip-chip packaging, the build-up layer packaging in accordance with the present invention, which is characterized in a low CTE substrate, has the following advantages:

1. In the traditional flip-chip packaging, the packaging substrate is composed of organic materials, such as a bismaleimide-triazine (BT) or a polyimide (PI), and the CTEs of such organic materials are much larger than that of the Si material of the die. Thus, a significant stress is certainly formed on the junction between the die and the packaging substrate to damage the packaging. Whereas, the substrates 410 and 420 in the present invention are composed mainly of ceramic materials, and so the difference of CTEs in between is relatively small. Therefore, the problem of connection breakage between the die and the substrate may be resolved.

2. In the flip-chip packaging of prior art shown in FIG. 1, a core substrate 10 is provided to support the circuit layers 12 and 14, and the packaging has a thickness equal to a sum of the die 20, the circuit layers 12 and 14, and the core substrate 10. On the other hand, as shown in FIG. 3E, the packaging of the present invention, which has a second ceramic substrate 420 to support the circuit layer 440, is provided with a die 500 located in a through hole 402 of the first ceramic substrate 410 and thereby a reduced thickness can be obtained.

Figure 1:
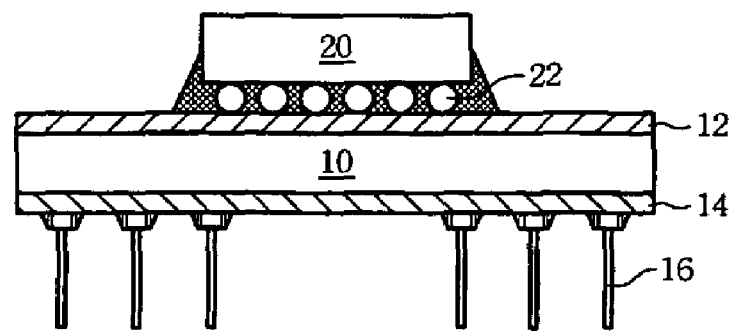
FIG. 1 depicts a schematic cross-section view of a typical flip-chip packaging.

3. Referring to FIG. 1, the signal generated in the die 20 must pass through the bump 22, the circuit layer 12, the core substrate 10, the circuit layer 14, and the pin 16 before leaving the packaging to reach the circuit on the main board. On the other hand, as shown in FIG. 3E, the signal generated in the die 500 in accordance with the present invention only needs to pass through the bump 510, the plug 330, the conductive pattern 340, and the circuit layer 440. It is obvious that the signal transmission distance of the present invention is significantly reduced and also the energy dissipation in the packaging is minimized.

Figure 2A:
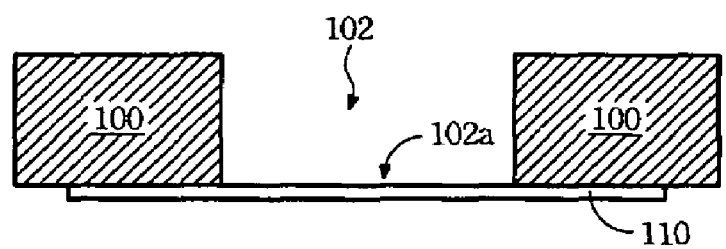
FIGS. 2A through 2F depict schematic cross-section views of a typical BBUL packaging process.

By contrast to the BBUL packaging, the packaging in accordance with the present invention has the following advantages:

1. As shown in FIG. 2A, the packaging substrate 100 of the traditional BBUL packaging is formed of organic materials such as BT or PI, and a significant stress can thus be formed on the junction between the die 200 and the packaging substrate 100. On the other hand, the first ceramic substrate 410 and the second ceramic substrate 420 in accordance with the present invention are formed of ceramic materials, and so the CTEs of the ceramic materials are closer than that of Si. Therefore, the stress formed between the die 410 and the second ceramic substrate 420 is much smaller, and the packaging in accordance with the present invention may have a longer lifetime.

Figure 2B:
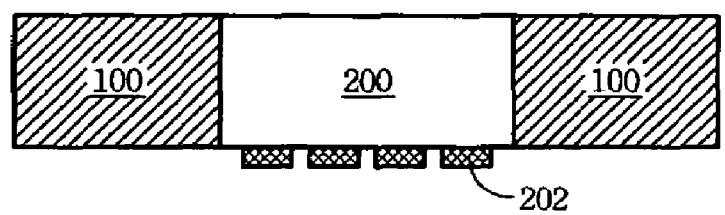
Figure 2C:
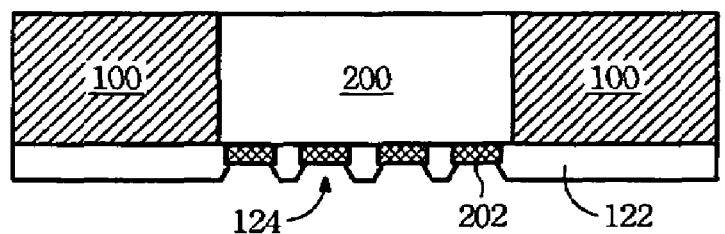
Figure 2:
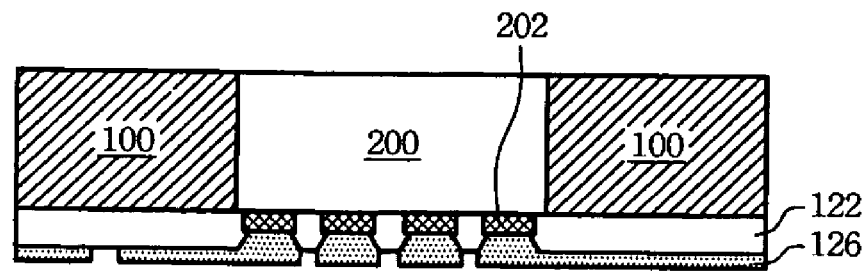
Figure 2:
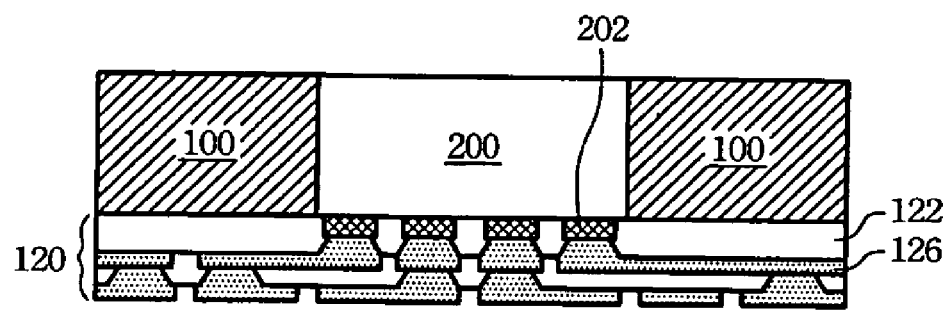
Figure 2:
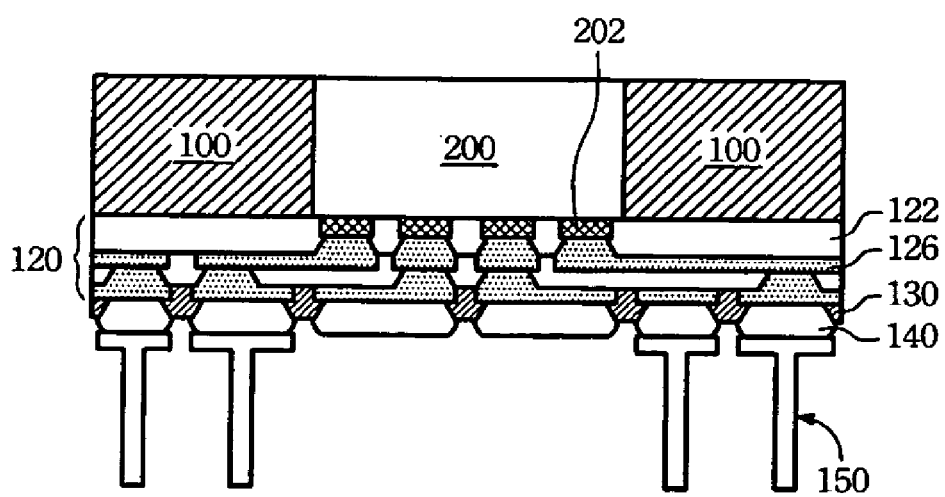

2. In FIGS. 2A and 2B, a die 200 of the traditional BBUL packaging is fixed in the packaging substrate 100 in an early step of the whole process. If any step shown in FIGS. 2C to 2E damages the packaging, the die 200 fixed inside the packaging substrate 100 cannot be taken away for a later re-usage. However, in a low CTE build-up layer packaging of the present invention, the die 500 is fixed in the first ceramic substrate 410 in a final step of FIG. 3E. It is possible to make sure that a good packaging structure has been achieved before the die 500 can be located into the packaging. Thus, possible waste of dies 500 from wrecking in the packaging may be avoided and thus the cost from the waste can be reduced as well.

With the example and explanations above, the features and spirits of the invention will be hopefully well described. Those skilled in the art will readily observe that numerous modifications and alterations of the device may be made when retaining the teaching of the invention. Accordingly, the above disclosure should be construed as limited only by the metes and bounds of the appended claims.

What is claimed is:

1. A build-up layer packaging, comprising:
   a die with a plurality of pads on a lower surface thereof;
   a first ceramic substrate with a through hole for placing the die;
   a second ceramic substrate, placed on a common lower surface of the first ceramic substrate and the die located in the through hole, further having a plurality of openings to expose the pads of the die, wherein the first ceramic substrate and the second ceramic substrate are attached with each other by sintering;
   a plurality of conductive plugs filling the openings and electrically connecting to the pads;
   a conductive pattern formed on a lower surface of the second ceramic substrate and connecting to the plugs; and
   a circuit layer formed on a common lower surface of the conductive pattern and the second ceramic substrate.

2. The build-up layer packaging of claim 1, wherein the first ceramic substrate and the second ceramic substrate are made of glass-ceramic material.

3. The build-up layer packaging of claim 1, further comprising a solder mask formed on a lower surface of the circuit layer.

4. The build-up layer packaging of claim 3, wherein the solder mask has a plurality of openings, and a plurality of pins, solder balls, or bumps are formed in the openings for electrically connecting to the pads through the circuit layer.

5. The build-up layer packaging of claim 1, wherein the conductive pattern forms a layout circuit layer.

6. The build-up layer packaging of claim 1, wherein the circuit layer has at least a grounded layer, a power supply layer, and a layout circuit layer.

7. The build-up layer packaging of claim 1, wherein the circuit layer is formed by using build-up layer technology.

8. The build-up layer packaging of claim 1, wherein the conductive pattern is formed of a metallic material.

9. A computer system formed on a circuit board, comprising:
   a bus;
   a memory connecting to the bus; and
   a build-up layer packaging connecting to the bus, further comprising:
   a die with a plurality of pads formed on a lower surface thereof;
   a first ceramic substrate with a through hole to locate the die therein;
   a second ceramic substrate formed on a common lower surface of the first ceramic substrate and the die, and further having a plurality of openings to expose the pads of the die, wherein the first ceramic substrate and the second ceramic substrate are held and attached with each other by sintering;
   a plurality of conductive plugs filling the openings and electrically connecting to the pads;
   a conductive pattern formed on a lower surface of the second ceramic substrate and connecting to the plugs; and
   a circuit layer formed on a lower surface of the conductive pattern and electrically connecting to the bus.

10. The computer system of claim 9, wherein the die is a microprocessor located in the through hole by using flip-chip technology.

11. The computer system of claim 9, wherein the first ceramic substrate and the second ceramic substrate are made of glass-ceramic material.

12. The computer system of claim 9, further comprising a plurality of bumps formed on the pads to connect to the plugs.

13. The computer system of claim 9, further comprising a solder mask with a plurality of openings formed on a lower surface of the circuit layer, and a plurality of pins, solder balls, or bumps are formed in the openings and electrically connected to the bus.

14. The computer system of claim 9, wherein the conductive pattern forms a layout circuit layer.

15. The computer system of claim 9, wherein the circuit layer has at least a grounded layer, a power supply layer, and a layout circuit layer.

16. The computer system of claim 9, wherein the circuit layer is formed by using build-up layer technology.

17. A communication chip system formed on a circuit board, comprising:
   a bus; and
   a build-up layer packaging connecting to the bus, further comprising:
   a communication chip with a plurality of pads formed on a lower surface thereof;
   a first ceramic substrate having a through hole to locate the communication chip therein;
   a second ceramic substrate, formed on a common lower surface of the first ceramic substrate and the communication chip, further having a plurality of openings to expose the pads of the communication chip, wherein the first ceramic substrate and the second ceramic substrate are held and attached with each other by sintering;
   a plurality of plugs filling the openings and electrically connecting to the pads;
   a conductive pattern formed on a lower surface of the second ceramic substrate and connecting to the plugs; and
   a circuit layer formed on a lower surface of the conductive pattern and electrically connecting to the bus.

18. The communication chip system of claim 17, further comprising a microprocessor connecting to the build-up layer packaging through the bus.

19. The communication chip system of claim 18 further comprising a plurality of bumps formed on the pads to connect to the plugs.

20. The communication chip system of claim 18 further comprising a solder mask with a plurality of openings formed on a lower surface of the circuit layer, and a plurality of pins, solder balls, or bumps are formed in the openings and electrically connected to the bus.

21. The communication chip system of claim 18, wherein the conductive pattern forms a layout circuit layer.

22. The communication chip system of claim 18, wherein the circuit layer has at least a grounded layer, a power supply layer, and a layout circuit layer.

23. The communication chip system of claim 18, wherein the circuit layer is formed by using build-up layer technology.

24. The communication chip system of claim 17, wherein the first ceramic substrate and the second ceramic substrate are made of glass-ceramic material.

* * * * *